US010816577B2

(12) United States Patent
Kennedy et al.

(10) Patent No.: US 10,816,577 B2
(45) Date of Patent: Oct. 27, 2020

(54) ELECTRIC FIELD DETECTION DEVICE AND METHODS OF USE THEREOF

(71) Applicant: Micatu Inc., Horseheads, NY (US)

(72) Inventors: James Kennedy, Corning, NY (US); Atul Pradhan, Pittsford, NY (US); Michael Oshetski, Horseheads, NY (US); William Laratta, Paris (FR)

(73) Assignee: MICATU INC., Horseheads, NY (US)

(*) Notice: Subject to any disclaimer, the term of this patent is extended or adjusted under 35 U.S.C. 154(b) by 67 days.

(21) Appl. No.: 16/215,987

(22) Filed: Dec. 11, 2018

(65) Prior Publication Data

US 2019/0178918 A1 Jun. 13, 2019

Related U.S. Application Data

(60) Provisional application No. 62/597,186, filed on Dec. 11, 2017.

(51) Int. Cl.
*G01R 15/24* (2006.01)
*G02F 1/03* (2006.01)
(Continued)

(52) U.S. Cl.
CPC ......... *G01R 15/242* (2013.01); *G01R 15/247* (2013.01); *G01R 19/155* (2013.01);
(Continued)

(58) Field of Classification Search
CPC .... G01N 21/21; G01N 21/23; G02B 6/12009; G02B 6/4213; G02B 6/4214;
(Continued)

(56) References Cited

U.S. PATENT DOCUMENTS 4,458,222 A 7/1984 Herstein et al.
4,639,666 A * 1/1987 Strosser ............... G01V 13/00
324/202
(Continued)

FOREIGN PATENT DOCUMENTS

WO    WO-8909413 A1 * 10/1989 ............. G01R 1/071

OTHER PUBLICATIONS

Jos. Schneider Optische Werke GmbH, Polarizers (Jun. 2017), available at https://schneiderkreuznach.com/application/files/3115/1860/3637/Datasheet-polarizer-filter-en.pdf (last accessed Jun. 4, 2020) (Year: 2017).*

(Continued)

*Primary Examiner* — Tung X Nguyen
*Assistant Examiner* — Robert P Alejnikov, Jr.
(74) *Attorney, Agent, or Firm* — Troutman Pepper Hamilton Sanders LLP (Rochester)

(57) ABSTRACT

One aspect of the present technology relates to an optical electric field sensor device. The device includes a non-conductive housing configured to be located proximate to an electric field. A voltage sensor assembly is positioned within the housing and includes a crystal material positioned to receive an input light beam from a first light source through a first optical fiber. The crystal material is configured to exhibit a Pockels effect when an electric field is applied when the housing is located proximate to the electric field to provide an output light beam to a detector through a second optical fiber. An optical cable is coupled to the housing and configured to house at least a portion of the first optical fiber and the second optical fiber. The first light source and the detector are located remotely from the housing. A method of detecting an electric field is also disclosed.

20 Claims, 12 Drawing Sheets

(51) Int. Cl.
    *G02B 6/44*     (2006.01)
    *G02B 6/42*     (2006.01)
    *G02B 6/27*     (2006.01)
    *G01R 19/155*     (2006.01)
    *G01R 29/08*     (2006.01)

(52) U.S. Cl.
    CPC ......... *G01R 29/0885* (2013.01); *G02B 6/276* (2013.01); *G02B 6/2706* (2013.01); *G02B 6/4213* (2013.01); *G02B 6/4214* (2013.01); *G02B 6/4441* (2013.01); *G02F 1/0327* (2013.01); *G02F 2201/02* (2013.01); *G02F 2203/50* (2013.01)

(58) Field of Classification Search
    CPC ..... G02B 6/276; G02B 6/2706; G02F 1/2955; G02F 15/242; G02F 1/0327; G01R 15/247; G01R 19/155; G01R 29/0885
    USPC .............................................. 324/95; 356/365
    See application file for complete search history.

(56) References Cited

U.S. PATENT DOCUMENTS

| | | | | |
|---|---|---|---|---|
| 4,714,343 | A * | 12/1987 | Ide | G01M 11/088 356/73.1 |
| 4,754,239 | A | 6/1988 | Sedivec | |
| 5,235,300 | A | 8/1993 | Chan et al. | |
| 5,389,782 | A * | 2/1995 | Hilliard | G01R 29/0885 250/227.17 |
| 5,600,439 | A * | 2/1997 | Csipkes | G01B 11/14 356/477 |
| 6,030,540 | A | 2/2000 | Yamamoto et al. | |
| 2009/0290165 | A1 * | 11/2009 | Bohnert | G01R 15/242 356/483 |
| 2012/0050125 | A1 | 3/2012 | Leiba et al. | |
| 2012/0242421 | A1 | 9/2012 | Robin et al. | |
| 2013/0099773 | A1 * | 4/2013 | Wildermuth | G01R 19/0046 324/96 |
| 2014/0300341 | A1 * | 10/2014 | Davis | G01R 15/247 324/97 |
| 2015/0097551 | A1 * | 4/2015 | Yao | G01K 11/32 324/96 |
| 2015/0268414 | A1 * | 9/2015 | Hayashi | G02B 6/42 398/142 |
| 2016/0013534 | A1 | 1/2016 | Pettus et al. | |
| 2017/0168103 | A1 * | 6/2017 | Ochrombel | G01R 29/24 |

OTHER PUBLICATIONS

PCT International Search Report and Written Opinion for corresponding PCT/US2018/067615, dated Mar. 15, 2019.

\* cited by examiner $$T_{WF} = \begin{bmatrix} r_{22} & r_{22} & 0 & r_{42} & 0 & 0 \\ r_{13} & r_{13} & r_{33} & 0 & 0 & 0 \end{bmatrix}_{r_2}$$

FIG. 5

ELECTRIC FIELD DETECTION DEVICE AND METHODS OF USE THEREOF

This application claims the benefit of U.S. Provisional Patent Application Ser. No. 62/597,186, filed Dec. 11, 2017, which is hereby incorporated by reference in its entirety.

FIELD

The present technology pertains to the field of optical sensors, and more specifically optical sensors for detecting electric fields using a Pockels crystal.

BACKGROUND

The ability to detect electric fields is important in a number of industries. For example, in the utility industry, detection of electric fields is necessary to measure electrical propertiers such as voltage potential and current. In addition to the measurement of electrical properties, detection of electric fields is important in industrial situations where ensuring that systems are de-energized is critical for safety. In these situations, it is not important that absolute values of electric field (e.g., voltage) be measured, only that their presence is detected.

Electric field detection is of primary importance in the electrical utility industry, where voltages and currents must be monitored at a generation source, on transmission grids, on distribution grids, and at final electrical circuits. Detecting and measuring electric fields at these location is paramount to ensuring that electricity is transmitted through the grid to end users at the correct voltage.

In addition to measuring electric fields for the delivery of electricity, there is a need within the utility industry to detect electric fields during maintenance situations. For example, electrical cables are often de-engerized during maintenance to allow for safer handling of electrical components. However, there is often no means available for individuals working at electrical substations or on powerlines to verify that systems are de-energized.

Similarly, there may be situations after storms, where electrical cables are broken and on the ground. Often, utility workers or emergency response personnel will encounter such broken cables on the ground. In those situations it is of paramount importance for these workers to be able to quickly determine whether these cables are electrically alive.

Other industries, such as the rail industry, have an acute need to detect electric fields. Often, during maintenance, portions of the electricity feeding rail lines or subways must be shut down. While care is taken to ensure the proper section of rail is de-energized, mistakes are always possible. Thus, there is a need for the ability to quickly determine whether an electric field is present for those working on rails to confirm the section being worked on has been de-energized.

Similarly, there are risks in manufacturing environments. Typically, lock-out and tag-out procedures are used to ensure a system in not energized when working on industrial machinery. This procedure is not only used to prevent electric shock, but also to ensure that machinery does not become operational during maintenance. However, even when lock-out/tag-out procedures are in place, it is important to confirm that there is no electrical energy present at the equipment being worked on as industrial equipment often contains multiple energy sources.

A number of technologies have been proposed for detecting electric fields that require the use of devices comprising antennas. For example, an antenna based device has been disclosed for sensing electric fields from compromised power cables in aircraft. Similarly, another disclosure provides an electric field sensor comprising an electric field sensor head for varying an intensity of a propagating light beam from a light source in response to an electric field intensity of an input signal received by a reception antenna. A photo-electric converter is used to convert the propagating light beam into an output signal. A correcting device compares the output signal with a reference signal to produce and supply a control signal to the photo-electric converter. Additionally, another disclosure provides an electric filed detection device comprising a Wheatsone bridge circuit wherein MOSFETs are connected in parallel to various resistor elements. Antennas are connected to the gates of the MOSFETs, and the antennas are disposed within an electric field. An output correlating to the electric field is generated due to the potential difference between antenna connected gates. These devices requiring antennas are often complicated and expensive to produce.

Other devices for detecting electric fields include an electric field detection device comprising a current amplifier, a power supply in an insulated chamber, a pair of electrodes and a display device. In the presence of static or active electric fields, a current is induced in the device and amplified for detection. Another device utilizes a rotating electric-field sensor comprising a compact instrument capable of measuring two-dimensional electric-field vectors, ranging from DC to an arbitrary upper AC frequency. The sensor uses a combination of quadrature modulation and phase-sensitive quadrature demodulation digital signal processing in a generic rotating electric-field sensor. Ground isolated versions of the instrument can be used singly or in arrays when precise measurements of the electric fields are necessary. These devices are similarly complicated and expensive to produce.

A number of device detecting electric fields have been proposed that employ Pockels crystals. For example, one device uses an electric field Pockels effect sensor that incorporates at least one measurement channel consisting of a monochromatic light source emitting an incident beam, a means of polarizing the incident beam along a first crystallographic direction of the crystal, a means for introducing the polarized incident beam into the crystal along a second crystallographic direction, a system for analyzing the light beam emerging from the crystal, and a detector of the analyzed light signal.

Another optical device provides an electric field meter using the Pockels effect wherein light is passed through a polarizer then through an optical fiber to be incident to a Pockels element. The light passed through the Pockels element is divided into two light beams by a beam splitter; one light beam is incident to a photodetector and the output thereof is input to a divide circuit through an A/D converter and the other light is incident to a second photodetector and the output thereof is inputted to the circuit through an A/D converter. The output of the converter is divided by the circuit to obtain an electric field intensity signal from which noise is removed. This meter is fairly complicated requiring beam splitters, multiple photodetectors, and A/D converters.

Another device provides an electric field voltage detector having a coupling structure of a Pockels element. In this device, an optical fiber delivers diffused light to the Pockels element that has a lens function. By precise placement of the optical fiber with respect to the lens of the Pockels element the light is focused and enters the element as parallel light.

Yet another disclosure provides an optical electric field measuring instrument to measure the intensity of an electric field with high sensitivity by attaching a dielectric, having a specific inductive capacity higher than that of an electro-optic crystal, to the side face of the electro-optic crystal in an electric field impressing direction. This instrument includes a light source, an optical fiber, a lens, a polarizer, a wave plate, a crystal, an analyzer, a second lens and optical fiber and a photoreceptor. The dielectric can be a rutile crystal, which has an inductive capacity higher than the optical crystal. The need for the dielectric crystal makes this device unnecessarily complex.

Another device provides an electric field detector that comprises means for generating a linearly polarized light, a polarizing element including a Pockels cell made from a Z-cutting quartz that transmits the polarized light toward a Z-direction and changes the phase difference of two light components of a crystal in response to the magnitude of the electric field strength.

A number of limitation exist in the area electric field sensors as detailed above. These limitations include the need for the sensors employed to have antennas, or in the case of optical sensors, split beams, dielectrics, or complex circuitry. All of these factors make the current electric field detecting technologies expensive, cumbersome to use, and otherwise impractical for the detection of electric fields in utility, transport, and industrial settings, by way of example.

The present invention is directed to overcoming these and other deficiencies in the art.

SUMMARY

One aspect of the present technology relates to an optical electric field sensor device. The optical electric field sensor device includes a non-conductive housing configured to be located proximate to an electric field. A voltage sensor assembly is positioned within the housing and includes a crystal material positioned to receive an input light beam from a first light source through a first optical fiber. The crystal material is configured to exhibit a Pockels effect when the electric field is applied through the crystal material when the housing is located proximate to the electric field to provide an output light beam to a detector through a second optical fiber. An optical cable is coupled to the housing and configured to house at least a portion of the first optical fiber and the second optical fiber. The first light source and the detector are located remotely from the housing.

Another aspect of the present technology relates to a method for detecting an electric field. The method includes providing the optical electric field sensor device of the present technology. The housing of the optical electric field sensor device is located proximate the electric field. Locating the housing proximate the electric field subjects the crystal material of the voltage sensor assembly to the applied electric field. The electric field is detected by measuring an optical phase change for the light input from the first light source.

The present technology advantageously provides an electric field sensor based on an optical Pockels sensor. The device utilizes a light source, an input optical fiber, a collimator, a polarizer, a Pockels crystal, an analyzer, an output optical fiber, a photodiode, and a processor system that provides a single continuous optical beam path from the light source to the photodiode through the apparatus components. Advantages of the present technology include providing a simple, light weight, low cost way of detecting electric fields. The device of the present technology can be handheld and easily deployed in many industrial and utility situations. The present technology may be employed to enhance safety in many work environments where there is a risk of electrocution if energized cables and systems are not identified. The present technology provides for a device and method for either detecting or measuring electric fields depending on the need.

BRIEF DESCRIPTION OF THE DRAWINGS

FIG. 5 is the reduced, contracted matrix of electro-optic Pockels coefficients and elements for symmetry reduced Lithium Niobate (point group symmetry 3 m).

DETAILED DESCRIPTION

One aspect of the present technology relates to an optical electric field sensor device. The optical electric field sensor device includes a non-conductive housing configured to be located proximate to an electric field. A voltage sensor assembly is positioned within the housing and includes a crystal material positioned to receive an input light beam from a first light source through a first optical fiber. The crystal material is configured to exhibit a Pockels effect when the electric field is applied through the crystal material when the housing is located proximate to the electric field to provide an output light beam to a detector through a second optical fiber. An optical cable is coupled to the housing and configured to house at least a portion of the first optical fiber and the second optical fiber. The first light source and the detector are located remotely from the housing.

Figure 1:
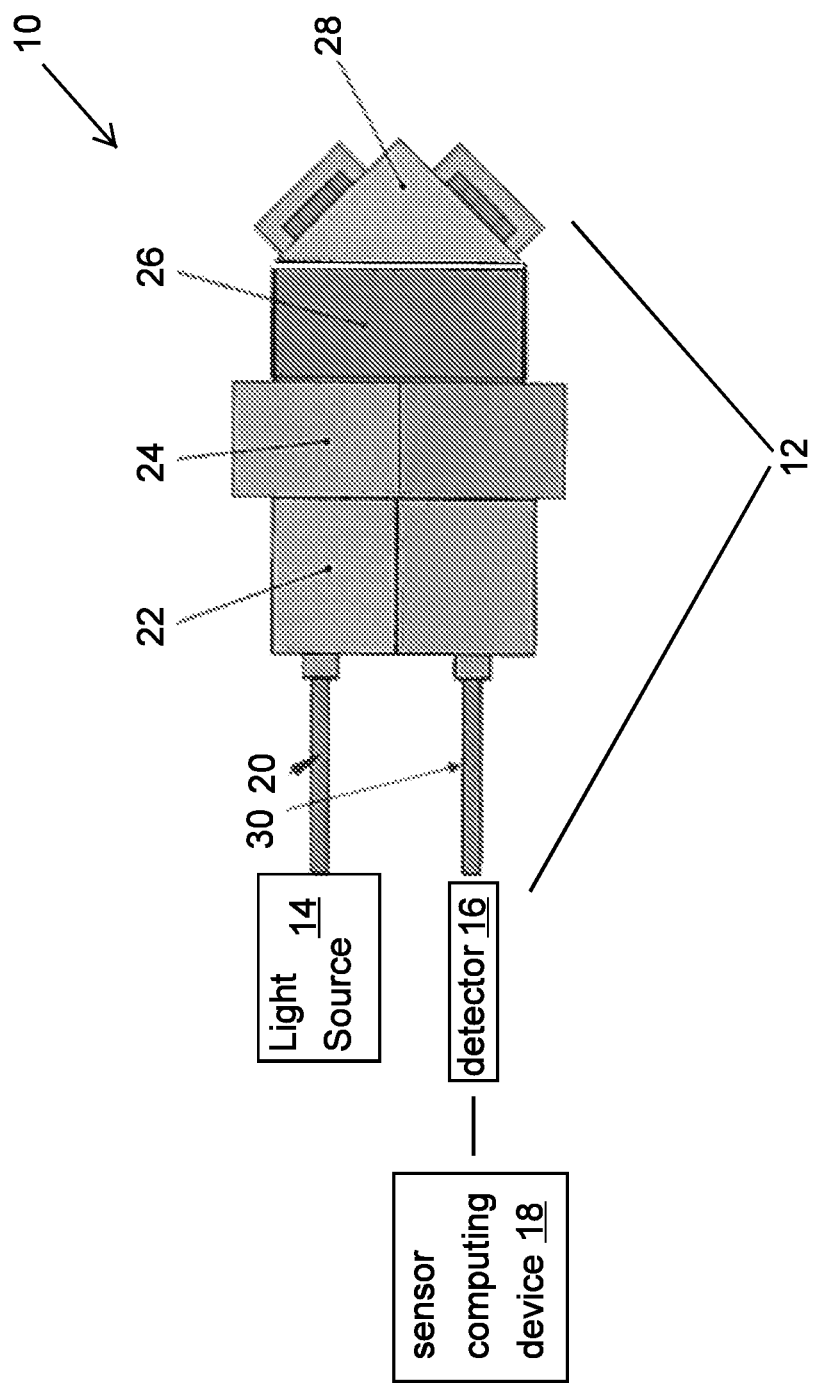
FIG. 1 is a partial schematic and partial block diagram of an exemplary system including an exemplary optical electric field sensor assembly of the present technology.

FIG. 1 is a partial schematic and partial block diagram of an exemplary system 10 including an exemplary optical electric field sensor assembly 12 of the present technology. The system 10 includes the optical electric field sensor assembly 12 coupled to a light source 14, a detector 16, and a sensor computing device 18. The system 10 may also include other types and numbers of elements, components, or devices in other configurations, including additional optics, such as lenses, prisms, or filters, or electronics, such as additional amplifiers, AC to DC converters, or transducers, by way of example only. Additional optics may be utilized, by way of example, to redirect, focus, collimate, or filter the wavelength of light with the system. Additional electronics may be utilized, by way of example, to condition the signal from the detector 16 to facilitate further processing. The technology described advantageously provides an all-optical sensor for detecting and measuring electric fields. By measuring the modulation of the light, the electric field across the crystal can be deduced.

The optical electric field sensor assembly 12 includes an input collimator 20, a collimator block housing 22, a spacer block 24, a crystal material 26, and a retro-prism subassembly 28, although the optical electric field sensor assembly 12 may include other types and/or numbers of additional components or elements in other configurations, such as a temperature sensor or probe as described below. The optical electric field sensor assembly 12 provides a single continuous beam path between the light source 14, through the crystal material 26, and to the detector 16.

The optical electric field sensor assembly 12 provides an electro-optic voltage sensor utilizing the Pockels effect in the crystal material 26 within an applied electric field or across which there is a voltage drop. The Pockels effect is observed as an intensity modulation of light due to the relative optical phase of polarized light between projections along principal axes of the index ellipsoid of the Pockels active crystal material 26. A differential phase shift is imprinted on the polarized light propagating through the crystal material 26 that is linearly proportional to the magnitude of the electric field applied or the voltage drop across the crystal material 26. The optical phase is detected as only a direct intensity modulation of polarized light exiting the non-linear optical crystal material 26 through an analyzing polarizer.

The intensity modulation of light is generated using a compact, robust, temperature and environmentally stable arrangement of a polarizer and analyzer system within the optical electric field sensor assembly 12.

Figure 2:
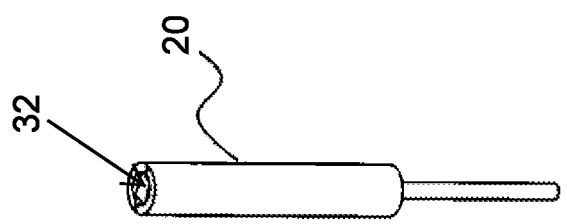
FIG. 2 is a perspective view of an exemplary collimator with a polarizer in front of its clear aperture that may be employed with the optical electric field sensor assembly illustrated in FIG. 1.

The input collimator 20 of the optical electric field sensor assembly 12 is coupled to the light source 14, such that the light source 14 provides an incoherent, coherent, or partially coherent light beam to the input collimator 20 as described below. In one example, the input collimator 20 is coupled to the light source through a fiber optic cable that allows the light source 14 to be located remotely from the optical components of the optical electric field sensor assembly 12. An input polarizer or analyzer may be embedded within, bonded to, or attached to the input collimator 20. By way of example, FIG. 2 shows an exemplary input collimator 20 with a polarizer 32 in front of its clear aperture that may be employed with the optical electric field sensor assembly 12. In one example, the polarizer 32 is a linear polarizer having a thickness of less than about 1.0 mm, although other polarizers of other dimensions may be employed.

The input linear polarizer 32 is embedded and bonded, contacted, adhered, epoxied, glued, attached, or otherwise integrated in the input collimator 20, although the input linear polarizer 32 may also be located in the collimator block housing 22 in the same manner. In one example, the input linear polarizer 32 is positioned and configured so that the linearly polarized light output from the input linear polarizer 32 propagates along one of the principal axes of an index ellipsoid of the crystal material 26 or along a linear combination of the principal axes of the index ellipsoid of the crystal material 26, by way of example. The input linear polarizer 32 may further be positioned and configured so that the linearly polarized light output from the input linear polarizer 32 has a polarization vector of light having a non-zero projection. By way of example, the polarization vector of light may be between about 22.5 degrees and about 67.5 degrees, with at least two principal axes of the modified index ellipsoid of the crystal material 26 in the presence of an external applied electric field, such that the difference in the indices of the two principal axes is non-zero and contains a Pockels optical phase term that is proportional to the applied electric field or voltage drop across the crystal material.

The integration of the polarizer 32 into the input collimator 20 and incorporation of the light polarization and analyzing components into an integrated solution with surface to surface attachment of all elements provides a robust and stable assembly over temperature. The assembly is also impervious to humidity or moisture and other degrading environmental conditions. Alternatively, the polarizer 32 may be incorporated into the collimator block housing 22.

Figure 3:
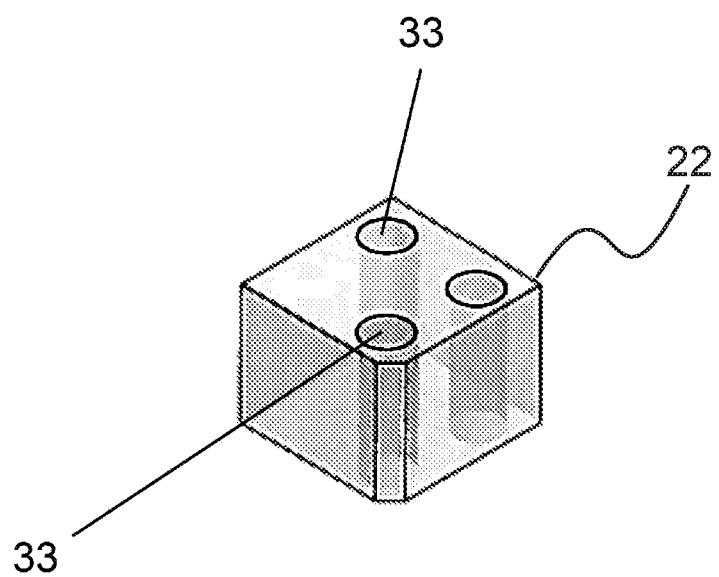
FIG. 3 is a side perspective view of an exemplary glass collimator block with cylindrical bore holes for insertion of the collimators that may be employed with the optical electric field sensor assembly illustrated in FIG. 1.

The collimator block housing 22 is configured to provide a housing for insertion of the input collimator 20 and the output collimator 30, although the collimator block housing 22 may house other elements, such as a polarizing element by way of example. As illustrated in FIG. 3, a glass or ceramic block may be used for the collimator block housing 22 to hold the input collimator 20 and the output collimator 30. The collimator block housing 22 includes bore holes 33 for securely receiving the input collimator 20 and the output collimator 30 therein. In one example, the input collimator 20 and the output collimator 30 are inserted and embedded, bonded, adhered, contacted, or attached in, or to the collimator block housing 22.

In one example, the collimator block housing 22 provides a thermal expansion coefficient similar to the glass material of the input collimator 20 and the output collimator 30 and any associated polarizers, such as the polarizer 32 shown in FIG. 2 by way of example only. This provides for pointing stability for the light beam delivered from the light source 14 in its path traversing the optical electric field sensor assembly 12 and through the crystal material 26, thereby reducing phase variations that can distort the modulated light intensity.

The collimator block housing 22 provides precise and stable opto-mechanical placement of the input collimator 20 and the output collimator 30, so as to ensure beam pointing stability and accuracy. The input collimator 20 and the output collimator 30 are embedded into the collimator block housing 22, which is subsequently attached or bonded to the spacer block 24 of the optical electric field sensor assembly 12, to attain successful beam propagation and fiber coupling from the input collimator 20 to the output collimator 30. The present technology provides for such a robust placement by inserting and bonding the input collimator 20 and the output collimator 30 into the collimator block housing 22 that is then bonded to the spacer block 24 of the optical electric field sensor assembly 12.

The spacer block 24 is coupled to the collimator block housing by way of example through an optical adhesive bonding, although other attachment mechanisms may be employed. In one example, the spacer block 24 is constructed of glass and located between the collimator block housing 22 and the Pockels crystal material 26 provides for a uniform and homogeneous optical interface, reducing thermal mismatch between the crystal material 26 and the glass materials. The surfaces of the glass spacer block 24 are flat with minimal curvature and low surface roughness in order to provide optimal surfaces for bonding the collimator block housing 22 assembly with the crystal material 26 through the spacer block 24, thereby integrating the optical electric field sensor assembly 12. Bonding the components to the glass spacer block 24 minimizes fluctuations due to thermal variation of intrinsic birefringence in the optical electric field sensor assembly 12.

The crystal material 26 is coupled to the spacer block 24 by way of example through an optical adhesive bonding. The crystal material 26 provides a Pockels crystal cell that exhibits strong optical phase modulation under electric field excitation, which requires careful design and fabrication. The requirements for the Pockels cell crystal material 26 are high electro-optic coefficients (pm/V) and a geometrical configuration such that the optical phase accumulates as a linear function of the optical path length. This would suggest a transverse modulator configuration for the Pockels cell crystal material 26 as opposed to a longitudinal configuration that is independent of length. This requires that the Pockels cell crystal material 26 be non-centrosymmetric. The crystal material 26 may be selected from one of crystal point group symmetry 3 m, $\overline{4}$2m, $\overline{4}$3m, m3 m, 4 mm, 2 mm, 23, or $\infty$.

Figure 4:
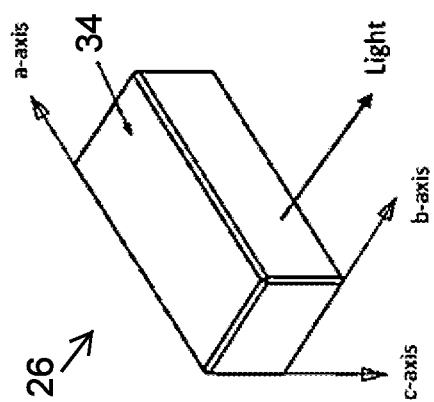
FIG. 4 is an exemplary crystal for use with the present technology with the indicated direction of propagation of light along the b-axis, the plane of polarization of light being defined by the a- and c-axes, and an applied electric field along the c-axis.

A number of materials may be used for the crystal cell material 26, including but not limited to C6H5O2N, Pb0.814La0.124(Ti0.6Zr0.4)O3 (PLZT), $\square$-Zns, ZnSe, ZnTe, Bi12SiO20, Ba0.25Sr0.75Nb2O6, KTa0.35Sr0.75Nb0.6503, CsH2AsO4, NH4H2PO4, NH4D2PO4, KD2PO4, KH2PO4, Lithium Niobate (LiNbO3), LiTaO3, BaTiO3 SrTiO3, Ag3AsS3, KNbO3, electro-optic polymers and other materials. In one example, crystalline lithium niobate (LiNbO3) is the choice Pockels crystal material 26 due to its low conductivity and the fact that under an electric field, charge carriers migrate to the crystal boundaries. The Pockels effect response could therefore also be enhanced with metallic coatings. FIG. 4 illustrates an exemplary Lithium Niobate crystal, by way of example, that may be utilized for the crystal material 26. The propagation of light from the light source 14 is along the b-axis, the plane of polarization being defined by the a and c axes, and the applied electric field along the c-axis. Designated surfaces 34 can be metallized in order to enhance and make uniform the electric field across the crystal material 26.

As is well known to those skilled in the art, the Pockel's effect is the first order response of the impermeability (the inverse of the relative permittivity) of a material to an electric field. The Pockels effect is generally described as a tensor that satisfies symmetry conditions and is non-vanishing only for non-centrosymmetric crystals. The Pockels effect tensor coefficients can be represented in a reduced contracted form as a 6×3=18 matrix set of values. In the presence of an applied electric field E, the index ellipsoid, in a Pockels effect material, is by definition:

$$\sum_{i=1}^{3}\left[\frac{x_i^2}{n_i}+\sum_{j=1}^{3}\sum_{k=1}^{6}r_{ki}E_ix_ix_j\right]=1 \quad (1)$$

Where $n_i$ is the refractive index along coordinate axis $x_i$ at zero electric field, $r_{ki}$ is the contracted Pockels coefficient and $E_i$ is the component of electric field along the $x_i$ axis. Therefore, in the presence of an external applied electric field, the index ellipsoid will in general be modified, distorted, and rotated from that of the original index ellipsoid of the material in absence of the electric field as denoted by the first three terms of equation (1). Under a suitable principal-axis coordinate transformation, the index ellipsoid can be transformed to the standard form:

$$\frac{x_{t,1}^2}{n_{t,1}^2}+\frac{x_{t,2}^2}{n_{t,2}^2}+\frac{x_{t,3}^2}{n_{t,3}^2}=1 \quad (2)$$

Where, now, the transformed indices (subscript t) are general functions of the standard indices in the absence of an electric field, the Pockels coefficients $r_{ki}$, and the electric field components, that is $$n_{t,i}=n_{t,i}(n_i,r_{ki},E_k) \quad (3)$$

Light traveling through the crystal material 26 will accumulate optical phase, in a complex manner, according to the projection of the polarization vector along the principal axes of the index ellipsoid after application of the electric field.

A non-limiting example configuration that may be used for the crystal material 26, which is readily available, is the Z-cut form which is of trigonal 3 m (C3v) crystal symmetry, according to Hermann-Manguin crystal notation, and which like all Pockels effect crystals is non-centrosymmetrc (lacking a center of inversion symmetry). For congruent Lithium Niobate, the principal axis symmetry reduced electro-optic Pockels tensor elements has eight non-vanishing components with only four unique values. For a transverse modulator configuration, with light propagating along the c-axis, and E-field along the b-axis, only two of the five non-zero Pockels tensor elements are relevant in the transformed principal axis index ellipsoid, namely, $r_{13}$ and $r_{33}$. The index ellipsoid relation, characterized by the ordinary ($n_o$) and extraordinary ($n_e$) refractive indices, is distorted by the Pockels terms as:

$$\frac{1}{n_o^2}(a^2+b^2)+\frac{c^2}{n_e^2}=1-r_{13}E(a^2+b^2)+-r_{33}Ec^2 \quad (4)$$

In this case, the optical phase of a polarized plane wave (b-axis) due to an integrated E-field or equivalent voltage drop across the width (d) of the crystal material 26 and propagation through the crystal material 26 (L) is given as:

$$\Gamma=\frac{2\pi}{\lambda}(n_e-n_o)L-\frac{\pi}{\lambda}(n_e^3r_{33}-n_o^3r_{13})\frac{L}{d}V \quad (5)$$

Where $\lambda$ is the wavelength of light, $n_e$ is the refractive index of the e-ray, $n_o$ is the refractive index of the o-ray, $r_{33}$ and $r_{13}$ are the electro-optic Pockels coefficients, L is the length of the crystal material 26 along the direction of propagation of light, d is the width of the crystal material 26 across which the voltage drop V(t) due to the external electric field applied. Note that we will refer to the first term due to pure birefringence ($\Phi_B$) and the second term as the Pockels term ($\Phi_P$). The Voltage drop V(t) is time dependent, for example, but not limited to Alternating Current (AC) voltage on power lines, so that a change or oscillation induces a modulation of the phase that is crucial to the methods and algorithms for determination of V(t) using the optical light. For a transverse modulator, the axes for the e-ray and o-ray are perpendicular to the optical propagation direction of light, so that the half wave voltage is given as:

$$V_\pi = \frac{d}{L} \frac{\lambda}{n_e^3 r_{33} - n_o^3 r_{13}} \qquad (6)$$

and is determined by the crystal design. In this technology, it was convenient to choose d=4 mm, L=6 mm, although other values may be selected. Based on typical values of the electro-optic coefficients the calculated value of $V\pi$ is approximately 1250 volts in single pass (2500 Volts in double pass with L=12 mm).

A simple expression for the optical transmission through the optical electric field sensor assembly 12 and the crystal material 26 due to the Pockels phase can be represented as:

$$\frac{I(t)}{I_o} = \sin^2\left[\pi \frac{V(t)}{V_\pi} + \Phi\right] \qquad (7)$$

Here $V(t)=V_m \sin(\omega t + \phi_{AC})$ is in this example, but not generally limited to, an AC voltage across the crystal, $\omega=2\pi\phi_{AC}$ is the angular frequency associated with 60 Hz AC line frequency, $\phi_{Ac}$ is the AC line phase shift, and $\Phi$ is a total track length optical phase factor associated with the optical electric field sensor assembly 12 which can contain all the non-Pockels dependent phase factors. These include natural birefringence, pyroelectric, space charge effects, and thermal expansion of the crystal material 26.

Noting that the overall optical phase factor in equation 7 is temperature dependent and can be taken to be calibration factor C(T), and assuming V is reasonably large compared to the voltage across the crystal material 26. The voltage can be solved for, generically from eqn. (7) as:

$$V(t, T) = \qquad (8)$$
$$\frac{V_\pi(T)}{\pi}\sqrt{\frac{Pac(t, T)}{Pdc}} - C(T)V(t, T) = \frac{V_\pi(T)}{\pi}\sqrt{\frac{Pac(t, T)}{Pdc}} - C(T)$$

where the temperature dependence of the term is explicitly indicated, and the optical beam intensities ($P_{ac}$, $P_{dc}$) are reinterpreted as optical AC modulated power on the photodiode and its DC component. The explicit inverse trigonometric term expression can be included in equation (8) to increase accuracy of the voltage drop calculation for larger values of $V_m$.

The retro-prism assembly 28 is coupled to the crystal material 26. The retro-prism assembly 28 is configured to receive light propagated through the crystal material 26 and reflect the propagated light beam twice back into the crystal material 26, although other configurations may be utilized. The retro-prism assembly 28 may have any configuration and made be constructed of any materials suitable to reflect the light beam twice back into the crystal material 26.

The output collimator 30 is positioned in the collimator block housing 22 to receive light directed by the retro-prism assembly back through the crystal material 26, the spacer block 24 and the collimator block housing 22. In one example, the output collimator 30 is coupled to the detector through a fiber optic cable that allows the detector 16 to be located remotely from the optical components of the optical electric field sensor assembly 12. The output collimator 30 is coupled to the detector 16 to provide the polarized light from the crystal material 26 based on the Pockels effect to the detector 16. An output polarizer or analyzer (similar to the input polarizer 32 shown in FIG. 2) can be embedded, bonded, or attached to the output collimator 30, through which the light is fiber-optically coupled as it exits the optical electric field sensor assembly 12. Alternatively, an output polarizer or analyzer can also be attached to other portions or components of the optical electric field sensor assembly 12 through which light passes after exiting the crystal material 26, such as the collimator block housing 22. In one example, the output linear polarizer is oriented with its polarizing axis along the direction of the light polarization vector that has non-zero projections on at least two principal axes of the index ellipsoid of the Pockels active crystal material 26 to induce a phase difference in the light field amplitude such that the exit light intensity is modulated or varies periodically.

Light source 14, in one example, may be any suitable laser diode that produces a temporally or spatially coherent, or partially coherent, light beam, such as a He Ne gas laser operating at a wavelength of approximately 632 nm. Alternatively, other laser diodes, operating at other wavelengths, such as 1310 or 1550 lasers, may be utilized. In another example, light source 14 may be a non-coherent source, such as a light emitting diode or superluminescent diode by way of example only, coupled with optics or filters to spectrally narrow the linewidth or spatially filter the emitted light beam.

The detector 16 is positioned to receive light beams reflected back through the crystal material 26 by the retro-prism assembly 28 through the output collimator 30. The detector 16 is configured to measure the optical phase of the product light beams from which the voltage of the applied field can be determined as described above. The detector 16 may be any suitable detector configured to measure the optical phase of the received light beam. The detector 16 may be coupled to additional electronics, such as an amplifier by way of example only, to prepare the signal from the detector 16, i.e., the measured optical phase of the product light beams, for further processing, although other electronics may be utilized to adjust the output signal.

Figure 6:
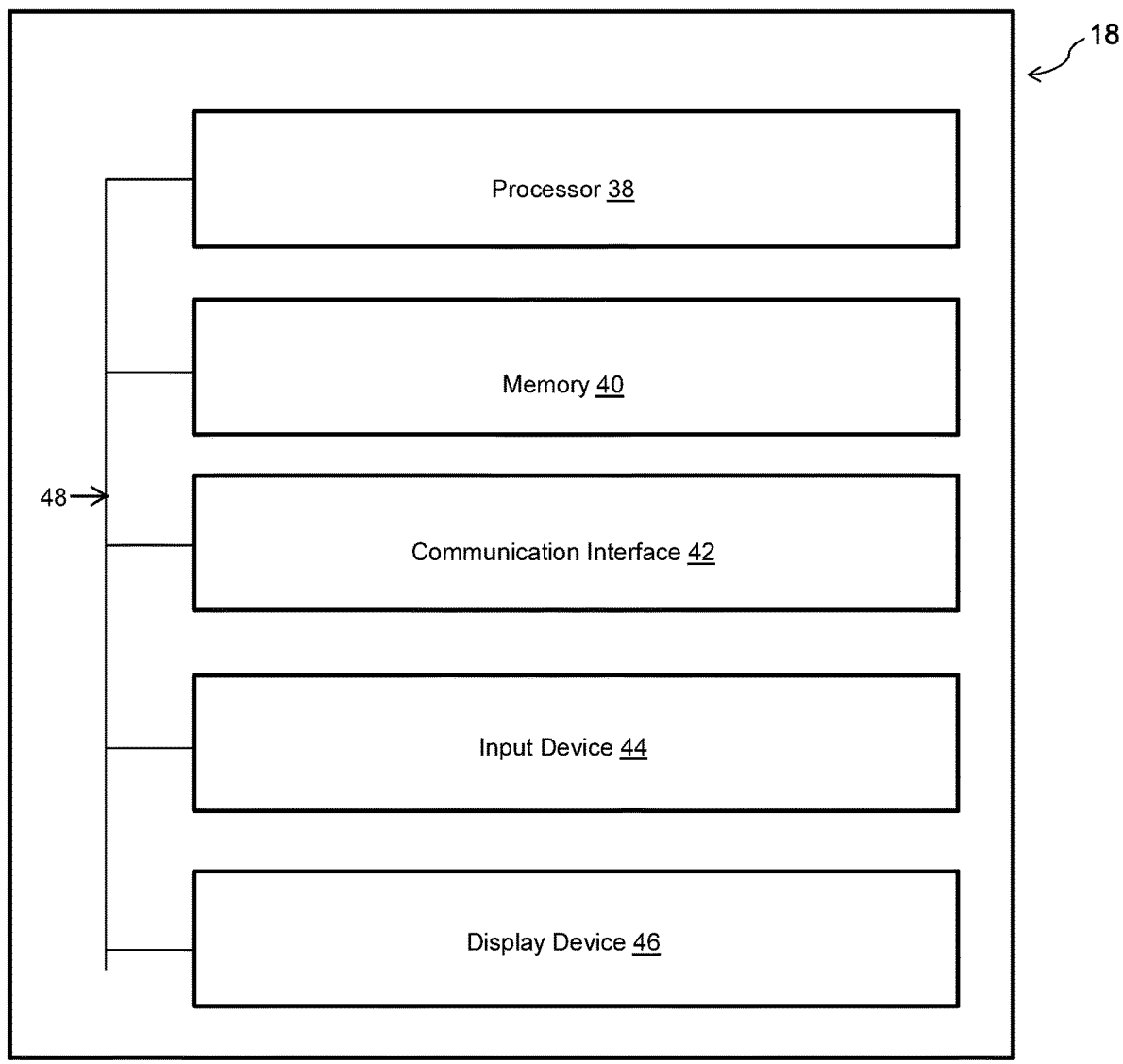
FIG. 6 is a block diagram of an exemplary sensor computing device for use in the system illustrated in FIG. 1.

The detector 16 is coupled to sensor computing device 18. Referring now more specifically to FIG. 6, sensor computing device 18 is configured to determine a voltage based on the optical phase of the light as measured by the detector 16 in accordance with the methods described herein. The sensor computing device 18 includes processor 38, memory 40, communication interface 42, input device 44, and display device 46, which are coupled together by bus 48 or other communication link, although other numbers and types of systems, devices, components, and elements in other configurations and locations can be used.

The processor 38 executes a program of instructions stored in the memory 40 for one or more aspects of the present technology. Other numbers and types of systems, devices, components, and elements in other configurations and locations can be used to execute the program of instructions stored in the memory 40.

The memory 40 stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor 38, can be used for the memory 40.

The communication interface 42 is used to operatively couple and communicate between the sensor computing device 18 and one or more other computing devices via a communications network. Other types and numbers of communication networks or systems with other types and numbers of connections and configurations can be used for communication between the sensor computing device 18 and one or more other computing devices. By way of example only, the communications network could use TCP/IP over Ethernet and industry-standard protocols, including NFS, CIFS, SOAP, XML, LDAP, and SNMP. Other types and numbers of communication networks, such as a direct connection, a local area network, a wide area network, modems and phone lines, e-mail, and wireless communication technology, each having their own communications protocols, can be used by the communication networks.

The input device 44 and the display device 46 of the sensor computing device 18 enable a user to interact with the sensor computing device 18, such as to input and/or view data and/or to configure, program, and/or operate the sensor computing device 18, by way of example only. The input device 44 may include a keyboard, computer mouse, and/or touch screen, and the display device 46 may include a computer monitor. Other types and numbers of input devices and/or display devices could also be used in other examples.

Figure 7:
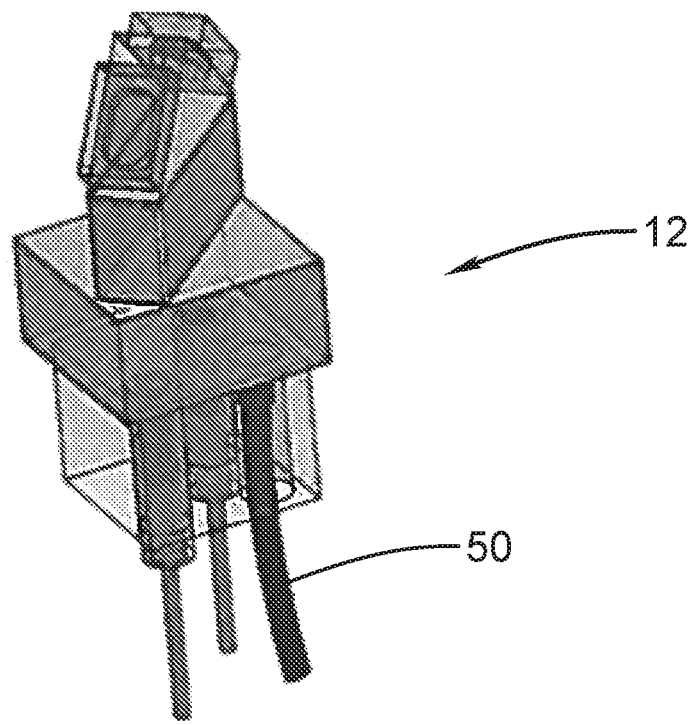
FIG. 7 is another exemplary optical electric feed sensor assembly including an embedded fiber optic temperature sensor probe inserted into one of the holes of the collimator block of the optical electric field sensor assembly shown in FIG. 1.

FIG. 7 is a perspective view of the exemplary optical electric field sensor assembly 12 illustrated in FIG. 1 with an embedded temperature sensor 50 or probe. The structure and operation of the optical electric field sensor assembly 12 in this example is the same as discussed with respect to FIG. 1 except as described below.

It is noted that light traversing through the crystal material 26 with a responsive Pockels effect experiences a phase modulation in the presence of an electric field or voltage difference across the dimensions of the crystal material 26. For the Pockels effect optical electric field sensor assembly 12, the magnitude and intensity of the phase modulation is affected by the temperature of the material through the dependence of the refractive indices and electro-optic Pockels tensor coefficients on temperature. In addition, the Pockels effect may be combined or masked by the effects of temperature on birefringence that also affects the phase of the light beam. In order to determine the strength of an externally applied electric field or voltage, these temperature effects must be considered and measured, and a calibration and/or compensation procedure that corrects for temperature variation must be formulated and applied for the Pockels effect optical electric field sensor assembly 12. This issue is not adequately addressed by the current state of the art and can be problematic for achieving accurate and repeatable determinations of voltage measurements using Pockels effect sensors, such as optical electric field sensor assembly 12.

Referring now to FIG. 7, in one example, the optical electric field sensor assembly 12 includes a temperature sensor 50. The temperature sensor 50 can be attached, embedded, or otherwise coupled to the Pockels effect crystal material 26. Alternatively, the temperature sensor 50 can be attached, embedded, or otherwise coupled to an optical assembly housing the Pockels effect crystal material 26. In yet another example, the temperature sensor 50 is located in proximity to, or within the ambient environment of, the Pockels effect optical electric field sensor assembly 12.

By way of example only, the temperature sensor 50, or probe, can be an electrical, optical, or mechanical temperature sensor. Without loss of generality, examples of temperature sensors or probes that may be utilized with the present technology include optical temperature sensors, such as by way of example only a GaAs bandgap fiber-optic temperature sensor, fluorescence fiber-optic temperature sensors, electrical temperature sensors such as thermocouples or thermistors, or temperature dependent driven mechanical flexures or MEMs temperature sensors, although other types of temperature sensors that could be used with Pockels effect optical electric field sensor assembly 12 for the purposes of temperature compensation or calibration. The temperature sensor 50 may be communicatively coupled to the sensor computing device 18 to provide temperature readings that may be used to provide temperature based calibration of the voltage measurements determined in the methods described above.

Figure 8:
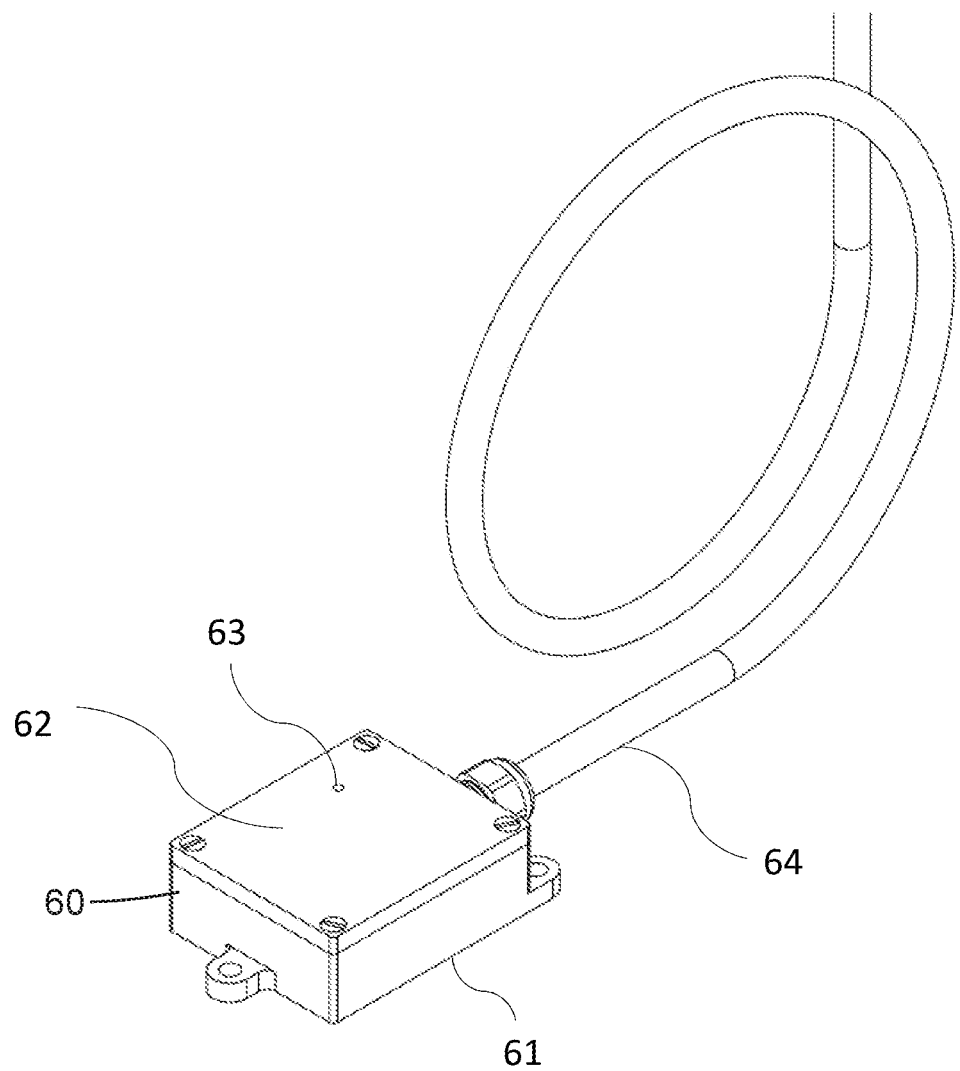
FIG. 8 is an exemplary electric field sensing device of the present technology.

FIG. 8 is an exemplary electric field sensing device 60 of the present technology, including an optical voltage sensor assembly as described herein. A key concern in the electric utility industry occurs when substation circuits, transmission lines, transformers, and similar power distribution components are energized or de-engergized. Typically, for safety, induction lamps are used to detect the presence of stray electromagnetic fields. Such lamps, which are made of glass and contain gases, illuminate in the presence of electric or magnetic fields. However, they are expensive, fragile, and their illumination is typically very weak. The present technology overcomes these challenges, in that it is rugged, highly sensitive, and produces a strong visual safety and warning signal in the presence of electric fields.

The electric field sensing device 60 comprises a housing that includes a receptacle tray 61 and a cover 62. In one example, the housing has a compact size that advantageously allows the electric field sensor device 60 to be employed in applications where there is limited space to locate the electric field sensing device proximate to the electric field to be sensed. In one example, the housing has length, width, and height dimensions less that 80×70×30 mm, although other dimensions may be employed for the housing. In one example, the housing is formed of a non-metal material such as a plastic, epoxy, ceramic, or glass. In one example, a strain relief element couples the fiber optic cable to the housing.

The receptacle tray 61 and cover 62 of the housing are formed of non-metal materials such as plastics, epoxies, ceramics or glass. The housing may further include a mechanism to provide a visual, tactile, or audible indication of the detected presence of an electric field near the electric field sensing device 60. In this example, a status window 63, is located on the housing of the electric field sensing device 60. The status window 63 is shown on the cover 62 of the device 60 in FIG. 8, however, the status window 63 can be located on the receptacle tray 61, or on any surface of the electric field sensing device. In this example, the status window 63 includes an optical fiber or a light guide. The optical fiber or light guide is connected to a remotely located light source, such as a light emitting diode (LED). The remote light source or LED is activated via a remote electrical circuit coupled to the detector that is triggered to turn on the light source or LED upon detection of an electric field by the voltage sensor assembly. The status window 63 on the sensor is therefore illuminated to visually indicate or signal the presence of an electric field, although notification techniques may be employed to signal the presence of an electric field, such as audible or tactile mechanisms, by way of example only.

While the image shown in FIG. 8 is one example of the electric field sensing apparatus, it should be clear to those skilled in the art that the apparatus can be configured in many different ways with respect to apparatus dimensions and shape, and that FIG. 8 does not limit the scope of the invention.

Figure 9:
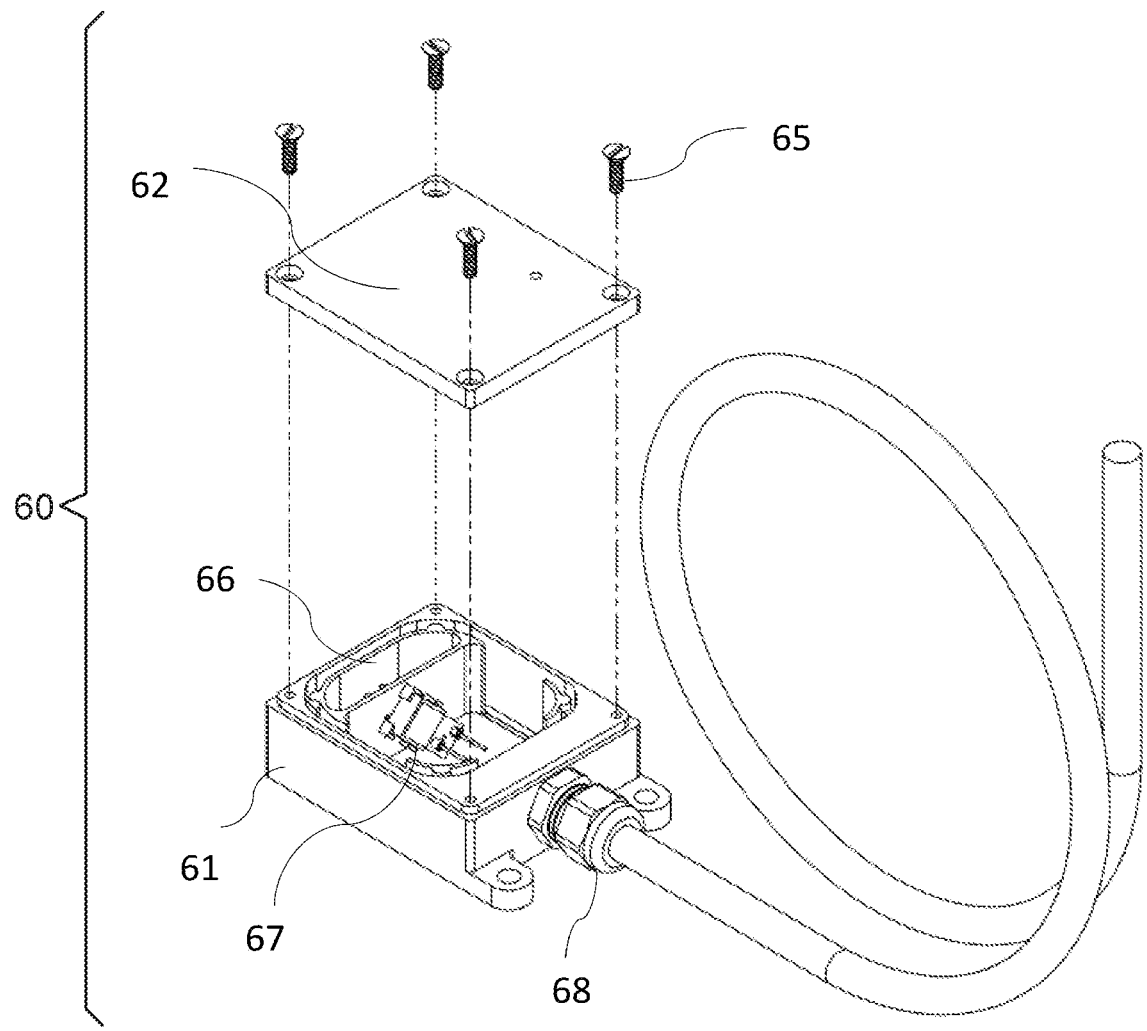
FIG. 9 is an exploded view of the electric field sensing device shown in FIG. 8.

FIG. 9 shows an exploded view of the electric field sensing apparatus 60 as shown in FIG. 8. The electric field sensing apparatus is formed of only non-metallic materials. In this example, four screws 65 are used to secure the cover 62 to the receptacle tray 61, although other types and numbers of attachment mechanisms may be employed. The screws 65 are formed of a non-metallic material, such as a plastic or a nylon material, by way of example only. The receptacle tray 61 includes a fiber management ring 66 and the optical Pockels sensor 67, such as the optical Pockels sensor described above. Optical fiber cables are located within an optical cable and enter the receptacle tray 61 through a strain relief 68.

Figure 10:
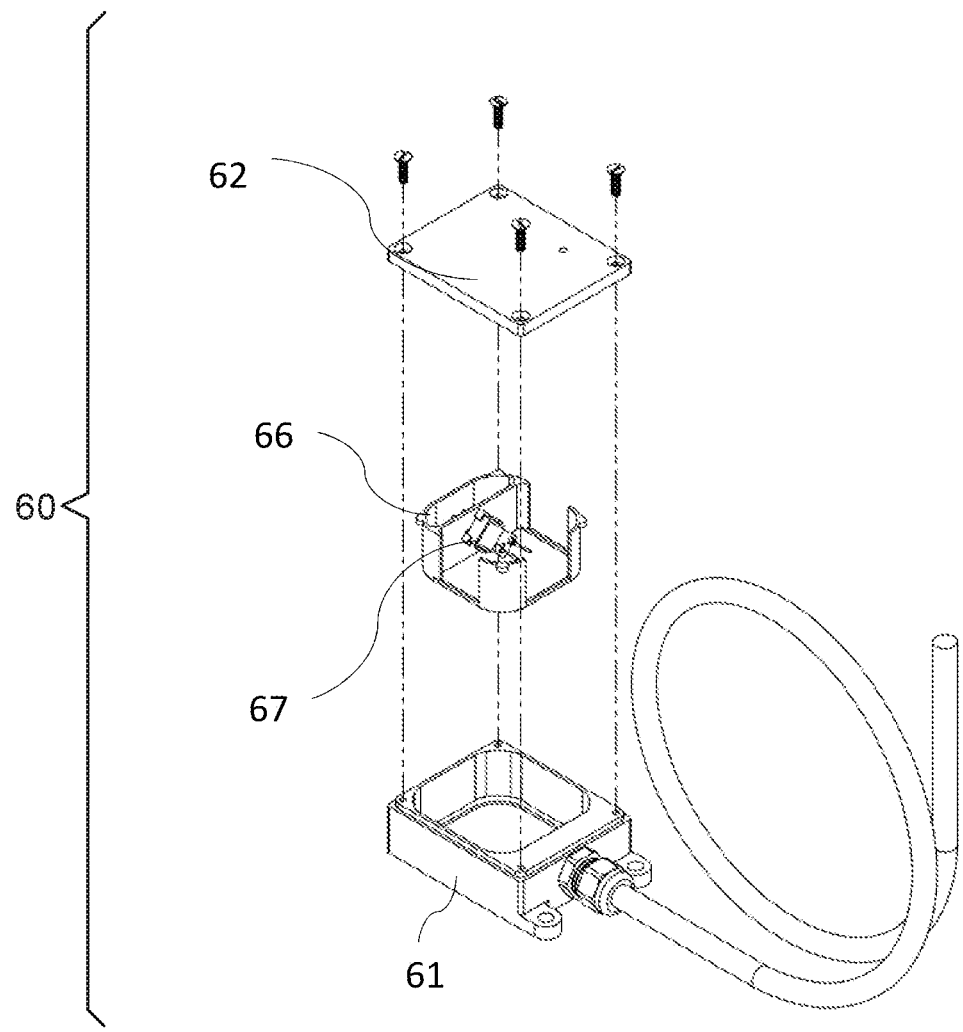
FIG. 10 is another exploded view of the electric field sensing device shown in FIG. 8, wherein the fiber management ring is separated from the receptacle tray.

FIG. 10 shows an exploded view of the electric field sensing apparatus with the fiber management ring 66 separated from the receptacle tray 61. The fiber management ring 66 if formed from a non-metal materials such as plastics, epoxies, ceramics or glass. In this non-limiting example, the optical Pockels sensor 67 is attached to the fiber management ring 66. In alternative examples, the optical Pockels 67 sensor may attach to the receptacle tray 61, the cover 62, or any other suitable portion of the sensor device. The operation of the optical Pockels sensor 67 is described in detail above.

Figure 11:
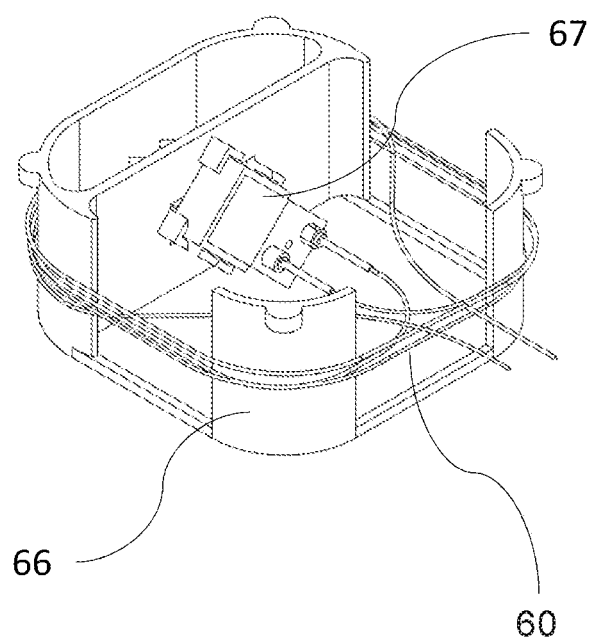
FIG. 11 is a view of the fiber management ring shown in FIG. 10 with fiber optic cables wrapped around the ring.

FIG. 11 shows the fiber management ring 66 with optical fiber cables 68 wrapped around it. The optical fiber cables 68 enter the sensing device, wrap about the fiber management ring 66, and then attach to the optical Pockels sensor 67. The fiber management ring ensures that the bend radius of the optical fibers entering the electric field sensing device 60 is greater than a minimum radius of in a range of 16 mm to 32 mm. Ensuring an optical fiber radius of greater than in a range of 16 mm to 32 mm reduces loss and fluctuations in optical power or intensity emanating from the fiber. Additionally, maintaining a minimum bend radius of greater than in a range of 16 mm to 32 mm maintains tensile strength of optical fiber, reduces micro-cracking of the fiber, reducing the risk of catastrophic failure. The bend radius also maintains the Failure in Time (FIT) over long durations consistent with reliability that must be warranted up to 30 years.

Figure 12:
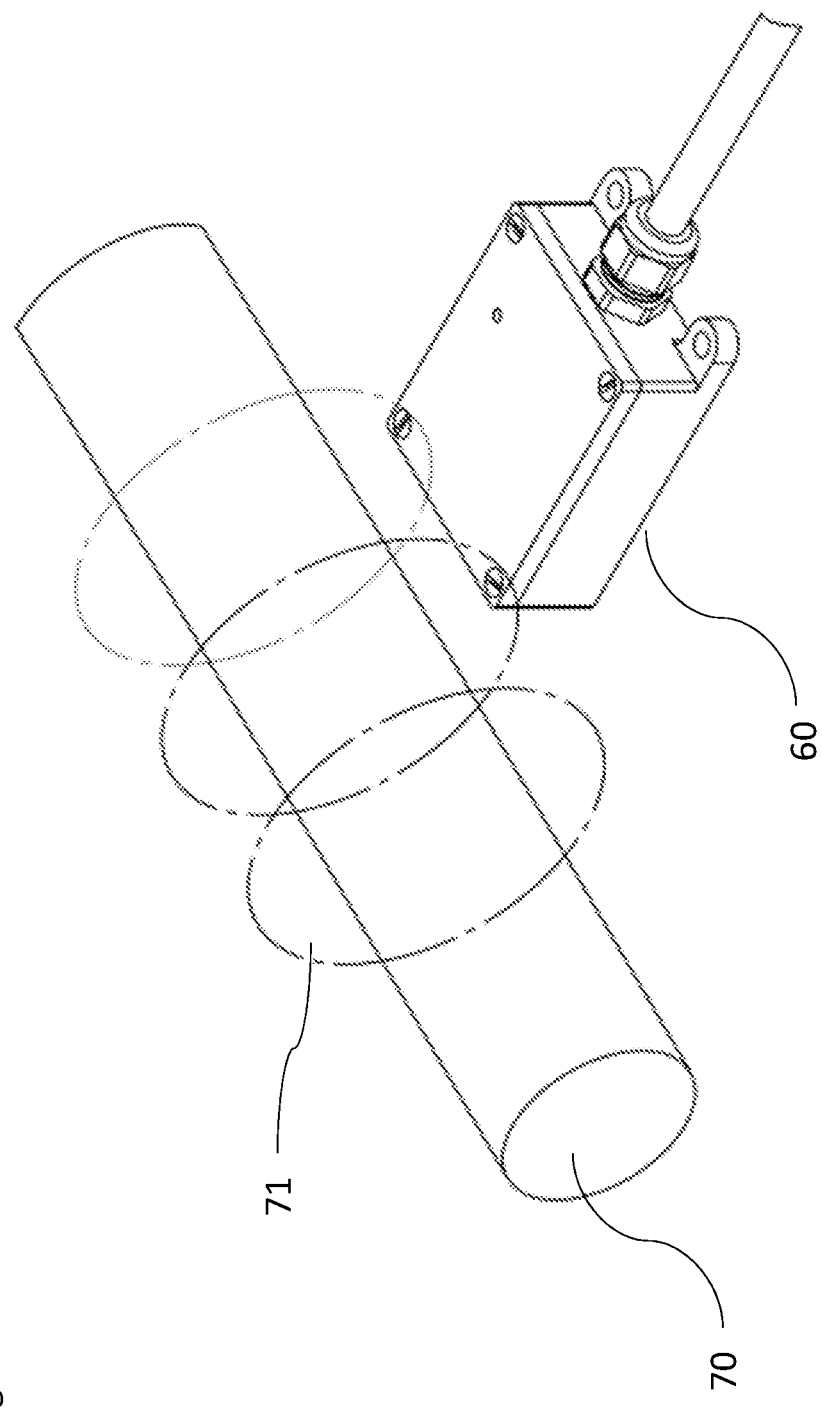
FIG. 12 shows the exemplary electric field sensing device of the present technology in the presence of an electric field.

FIG. 12 show the electric field sensing device 60 in an electric field 71. In this figure, the electric field is generated by a current carrying cable 70. The electric field sensing device 60 can be utilized to detect multiple sources of electric fields, including voltage potentials, and capacitive and inductive phenoma, among others.

An exemplary operation of the system including the optical electric field sensor assembly 12 will now be described. Light from an incoherent, coherent, or partially coherent light source 14 is delivered by the input fiber collimator 12, which is inserted into the collimator block housing 22. In one example, referring to FIG. 2, the light travels through the polarizer 32 before being introduced into the spacer block 24 and into the crystal material 26. The beam of light is thus linearly polarized before entering the crystal material 26 along the direction of the crystal optic axis (b-axis) as shown in FIG. 4. The polarization state has a non-zero projection with the a-axis and c-axis, and ideally for the case of Lithium Niobate is at 45 degrees with respect to the these axes.

The polarized light beam is reflected twice by the specially designed retro-prism assembly 28, and re-enters the crystal material 26 again. Based on the Pockels effect, with an electrical field applied to the crystal material 26, an optical phase is imparted to the light, which is then, in general, elliptically polarized. Upon exiting the crystal material 26, the light with imparted optical phase is incident on the output polarizer, or analyzer, which may be located in the output collimator 30 or within the collimator block housing 22.

The orientation of the analyzer ideally is coincident with the polarization vector of the light producing maximum modulation of light associated with the time dependent electric field applied across the crystal material 26. For Lithium Niobate in a transverse modulator configuration (equation 8, supra), this corresponds to the semi-major axis of the outgoing elliptically polarized light. The detector 16 measures the imparted optical phase. The sensor computing device 18 then computes a voltage based on the optical phase measured by the detector. The sensor computing device 18 may then output the computed voltage. Alternatively, the sensor computing device 18 may simply provide a notification of the presence of the electrical field, such as through a visual signal.

Accordingly, the electric field sensor of the present technology has many applications in the utility, transport, and industrial settings. Non-limiting examples can include ensuring cables and equipment are deenergized in the electricity transmission, electricity distribution, and electricity generation environments. Likewise, it can be used to confirm that overhead power lines and third rails are deenergized in the rail industry, and that manufacturing equipment is deenergized in industrial settings. Applications for the present technology are extremely broad and may include all situations where an electric field may be present, including applications on land, in the sea, or in outerspace. The present technology allows utility workers to confirm when electric fields are, and are not, present by using a more rugged and reliable electric field detection system that provides a signal, such as a bright visual signal, for the purposes of safety and warning.

Similar problems are encountered in rail transport, where sections of a rail line are de-energized before maintenance commences. As in the utility industry, it is critical to confirm that sections being worked on are de-engerized, and the present technology provides a reliable, sensitive system for doing so.

It should be understood that the description and specific examples presented here, while indicating preferred embodiments of the invention, are given by way of illustration only, since various changes and modifications within the spirit and scope of the invention will become apparent to those skilled in the art from this detailed description.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An optical electric field sensor device comprising:
   a non-conductive housing configured to be located proximate to an electric field;
   a voltage sensor assembly positioned within the housing, the voltage sensor assembly comprising a crystal material positioned to receive an input light beam from a first light source through a first optical fiber, wherein the crystal material is configured to exhibit a Pockels effect when the electric field is applied through the crystal material when the housing is located proximate to the electric field to provide an output light beam to a detector through a second optical fiber;
   an optical cable coupled to the housing and configured to house at least a portion of the first optical fiber and the second optical fiber, wherein the first light source and the detector are located remotely from the housing;
   a second light source coupled to the detector and configured to be activated when the detector detects a presence of the electric field; and
   a third optical fiber coupled to the second light source and delivered to the housing through the optical cable, wherein the housing further comprises a window to display the third optical fiber therein to provide a visual indication of the presence of the electric field at the window of the housing.

2. The optical electric field sensor device of claim 1, wherein the voltage sensor assembly provides a single continuous beam path between the light source, through the crystal material, and to the detector.

3. The optical electric field sensor device of claim 1, wherein the housing is formed of plastic, epoxy, ceramic, or glass.

4. The optical electric field sensor device of claim 1 further comprising a strain relief element coupling the optical cable to the housing.

5. The optical electric field sensor device of claim 1, wherein the housing further comprises a fiber management ring configured to hold at least the first optical fiber and the second optical fiber, wherein the fiber management ring delivers the first optical fiber and the second optical fiber to the voltage sensor assembly at a bend radius.

6. The optical electric field sensor device of claim 5, wherein the fiber management ring delivers the first optical fiber and the second optical fiber to the voltage sensor assembly at a bend radius of between 16 mm to 32 mm.

7. The optical electric field sensor device of claim 1, wherein the crystal material is a non-centrosymmetric crystal material of crystal point group symmetry 3 m, $\overline{4}2$m, $\overline{4}3$m, m3 m, 4 mm, 2 mm, 23, or ∞.

8. The optical electric field sensor device of claim 1, wherein the crystal material is selected from the group consisting of $C_6H_5O_2N$, $Pb_{0.814}La_{0.124}(Ti_{0.6}Zr_{0.4})O_3$ (PLZT), β-Zns, ZnSe, ZnTe, $Bi_{12}SiO_{20}$, $Ba_{0.25}Sr_{0.75}Nb_2O_6$, $KTa_{0.35}Sr_{0.75}Nb_{0.65}O_3$, $CsH_2AsO_4$, $NH_4H_2PO_4$, $NH_4D_2PO_4$, $KD_2PO_4$, $KH_2PO_4$, Lithium Niobate ($LiNbO_3$), $LiTaO_3$, $BaTiO_3$ $SrTiO_3$, $Ag_3AsS_3$, $KNbO_3$, and electro-optic polymers.

9. The optical electric field sensor device of claim 1, wherein the voltage sensor assembly further comprises:
   an input collimator positioned and configured to collimate the input light beam from the first light source through the first optical fiber;
   an output collimator positioned to receive the output light beam from the crystal material and configured to focus the output light beam from the crystal onto the detector through the second optical fiber; and
   a retro-prism device coupled to the crystal material and positioned to receive light directed from the input collimator through the crystal material, wherein the retro-prism device is configured to redirect the light received through the crystal material back through the crystal material to the output collimator.

10. The optical electric field sensor device of claim 1, wherein the voltage sensor assembly further comprises:
    an input linear polarizer positioned and configured to polarize the input light beam from the first light source; and
    an output linear polarizer positioned and configured to polarize the output light beam from the crystal material, wherein the input linear polarizer and the output linear polarizer have a thickness of less than about 1.0 mm.

11. A method for detecting an electric field comprising:
    providing the optical electric field sensor device of claim 1;
    locating the housing of the optical electric field sensor device proximate the electric field, wherein locating the housing proximate the electric field subjects the crystal material of the voltage sensor assembly to the applied electric field; and
    detecting the electric field by measuring an optical phase change for the light input from the first light source.

12. The method of claim 11, wherein the voltage sensor assembly provides a single continuous beam path between the light source, through the crystal material, and to the detector.

13. The method of claim 11, wherein the housing is formed of plastic, epoxy, ceramic, or glass.

14. The method of claim 11 further comprising providing a strain relief element coupling the optical cable to the housing.

15. The method of claim 11, wherein the housing further comprises a fiber management ring configured to hold at least the first optical fiber and the second optical fiber, wherein the fiber management ring delivers the first optical fiber and the second optical fiber to the voltage sensor assembly at a bend radius.

16. The method of claim 15, wherein the fiber management ring delivers the first optical fiber and the second optical fiber to the voltage sensor assembly at a bend radius of between 16 mm to 32 mm.

17. The method of claim 11, wherein the crystal material is a non-centrosymmetric crystal material of crystal point group symmetry 3 m, $\overline{4}2$m, $\overline{4}3$m, m3 m, 4 mm, 2 mm, 23, or ∞.

18. The method of claim 11, wherein the crystal material is selected from the group consisting of $C_6H_5O_2N$, $Pb_{0.814}La_{0.124}(Ti_{0.6}Zr_{0.4})O_3$ (PLZT), β-Zns, ZnSe, ZnTe, $Bi_{12}SiO_{20}$, $Ba_{0.25}Sr_{0.75}Nb_2O_6$, $KTa_{0.35}Sr_{0.75}Nb_{0.65}O_3$, $CsH_2AsO_4$, $NH_4H_2PO_4$, $NH_4D_2PO_4$, $KD_2PO_4$, $KH_2PO_4$, Lithium Niobate ($LiNbO_3$), $LiTaO_3$, $BaTiO_3$ $SrTiO_3$, $Ag_3AsS_3$, $KNbO_3$, and electro-optic polymers.

19. The method of claim 11, wherein the voltage sensor assembly further comprises:
    an input collimator positioned and configured to collimate the input light beam from the first light source through the first optical fiber; and
    an output collimator positioned to receive the output light beam from the crystal material and configured to focus the output light beam from the crystal onto the detector through the second optical fiber; and a retro-prism device coupled to the crystal material and positioned to receive light directed from the input collimator through the crystal material, wherein the retro-prism device is configured to redirect the light received through the crystal material back through the crystal material to the output collimator.

20. The method of claim 11, wherein the voltage sensor assembly further comprises:

an input linear polarizer positioned and configured to polarize the input light beam from the first light source; and an output linear polarizer positioned and configured to polarize the output light beam from the crystal material, wherein the input linear polarizer and the output linear polarizer have a thickness of less than about 1.0 mm.

* * * * *